(12) United States Patent
Patelmo et al.

(10) Patent No.: US 6,677,206 B2
(45) Date of Patent: Jan. 13, 2004

(54) NON-VOLATILE HIGH-PERFORMANCE MEMORY DEVICE AND RELATIVE MANUFACTURING PROCESS

(75) Inventors: Matteo Patelmo, Trezzo S/Adda (IT); Federico Pio, Brugherio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 151 days.

(21) Appl. No.: 09/740,407

(22) Filed: Dec. 19, 2000

(65) Prior Publication Data

US 2001/0030335 A1 Oct. 18, 2001

(30) Foreign Application Priority Data

Dec. 20, 1999 (IT) .......................... MI99A2651

(51) Int. Cl.[7] .......................................... H01L 21/336
(52) U.S. Cl. ..................... 438/276; 438/278; 438/289; 438/290; 438/305; 438/306; 438/307
(58) Field of Search ................................ 438/276, 278, 438/289, 290, 305, 306, 307

(56) References Cited

U.S. PATENT DOCUMENTS

| | | | |
|---|---|---|---|
| 5,486,487 A | * | 1/1996 | Ginami et al. .............. 438/276 |
| 5,886,926 A | * | 3/1999 | Marquot ................. 365/185.21 |
| 6,027,978 A | * | 2/2000 | Gardner et al. ............. 438/289 |

OTHER PUBLICATIONS

Wolf Ph.D., Stanley, Richard N. Tauber, Ph.D., "Refractory Metals and Their Silicides in VLSI Fabrication," Silicon Processing for the VLSI Era: vol. 1—Process Technology, Lattice Press, 1986, pp. 397–399.*

* cited by examiner

Primary Examiner—Amir Zarabian
Assistant Examiner—Toniae M. Thomas
(74) Attorney, Agent, or Firm—Lisa K. Jorgenson; Jon A. Gibbons; Fleit, Kain, Gibbons, Gutman, Bongini & Bianco P.L.

(57) ABSTRACT

A non-volatile memory device including a plurality of memory cells, each memory cell formed as MOS transistor with a source region, a drain region and a gate having sides formed therewith; and one or more dielectric spacers disposed on the sides of the gate. At least one memory cell is defined in an ON state and at least one memory cell is defined in an OFF state. The memory cells in the ON state comprise drain regions and source regions of the lightly diffused drain (LDD) type, characterized in that the at least one drain region and the at least one source region of the memory cells in the OFF state are formed by one or more high dopant regions. The memory cells in the OFF state consists of layers of silicide on top of one or more active regions defined as the source region, the drain region, and the gate.

8 Claims, 2 Drawing Sheets

NON-VOLATILE HIGH-PERFORMANCE MEMORY DEVICE AND RELATIVE MANUFACTURING PROCESS

CROSS-REFERENCE TO RELATED APPLICATIONS

This application is based upon and claims priority from prior Italian Patent Application No. MI99A002651, filed Dec. 20, 1999, the entire disclosure of which is herein incorporated by reference in its entirety.

BACKGROUND OF THE INVENTION

1. Field of the Invention

The present invention relates to a non-volatile high-performance memory device, more specifically a MOS or CMOS memory device and a process for the manufacture of a MOS or CMOS memory device.

2. Description of Related Art

Non-volatile memories are used widely in systems containing microprocessors or in other types of integrated circuits. Because of today's need of non-volatile memories with higher and higher performance memory capacity, semiconductor manufacturers are carrying out continuous research into the reduction of the dimensions of the memories and an increase in the density of the data stored.

For reasons which concern the consumption of power, the single nonvolatile memory cell usually consists of a MOS N-channel or P-channel transistor while the reading circuitry of the memory cells is usually made by CMOS technology. Therefore an array of memory cells coincides with an array of transistors whose reading current (with special polarization of the drain and gate terminals of the memory cell that has been addressed) determines the logic state of the cell, that is, if the cell is ON (logic state 1 or ON state) or is OFF (logic state 0 or OFF state).

The differentiation of the ON or OFF cells can come about physically by interrupting the current path between drain and source, for example, by eliminating the contact of one of the terminals or interrupting the active area.

It is also possible to carry out the programming of the non-volatile memories by implanting or not implanting the source and drain junctions when the corresponding plants are carried out in the transistors. In this case memories which are difficult to decode are obtained, that is they are relatively safe, as required by various SMART CARD applications.

A process for producing a memory whose programming is carried out by means of the above-mentioned technique is described in EP 0575688, which is herein incorporated by reference in its entirety. The EP 0575688 patent describes a process for manufacturing and programming a non-volatile ROM memory consisting of a matrix of memory cells arranged in lines and columns and each of the cells has drain and source regions of the LDD type (lightly diffused drain) separated by a channel region overlapped by the gate structure in a semiconductor substrate. The process includes the steps of formation of the structure of the gate, of the drain regions and the formation of a dielectric spacer at the sides of the gate. The process is characterized by a succession of steps which provide the definition of a portion of the drain area that is adjacent to the gate of the memory cell that is programmed in OFF state, making it permanently non-conductive by subsequently implanting a dopant with conductivity of the same type as that of the substrate. Following this implanting, a new mask is used for a successive implant step of the source region of the cell to increase the doping level. Next a layer of dielectric is formed. The openings to contact the drain regions of the memory cells are defined. A dopant is implanted to increase the doping level of the regions below the contact areas and the drain contacts are formed.

The process described above although useful, is not without its shortcomings. One shortcoming is the need to provide higher performance or faster memory cells. In order to provide faster memory cells, designers of memory cells form silicide on the gates and silicide on the junctions. However, silicide cannot be formed on layers of silicon that are only slightly doped because the known processes for the formation of the silicide consumes both metal and silicon. For example a junction with silicide, such as an LDD junction with silicide, would result in a short circuit in the substrate due to the dispersion of the metal in the silicide layer.

Accordingly, a need exists to provide a process and a non-volatile memory cell to overcome this shortcoming.

SUMMARY OF THE INVENTION

Briefly, in accordance with the present invention, a non-volatile memory device consisting of memory cells, each one formed as a MOS transistor with source and drain regions and a gate structure with a dielectric spacer placed at the sides of the gate, some of the memory cells being in an ON state and other memory cells in an OFF state, the memory cells in the ON state having drain and source regions of the LDD type, characterized in that the drain and source regions of the memory cells in the OFF state are formed by highly doped regions and the memory cells in the ON state and the memory cells in the OFF state show layers of silicide above their active regions.

In another embodiment, a manufacturing process is disclosed for making a high performance non-volatile memory device using silicide.

BRIEF DESCRIPTION OF THE DRAWINGS

The characteristics and advantages of the present invention will appear evident from the following detailed description of embodiments thereof, illustrated as non-limiting examples in the enclosed drawings, in which.

DESCRIPTION OF THE EMBODIMENTS

Figure 1:
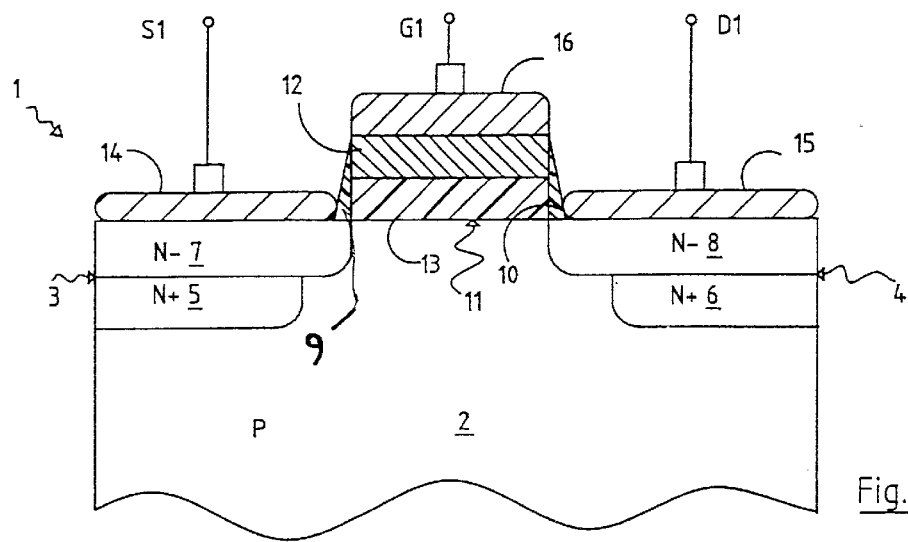
FIG. 1 is a sectional view of a memory cell consisting of an LDD transistor in the ON state.

It is important to note that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

In the drawing like numerals refer to like parts through several views.

Figure 2:
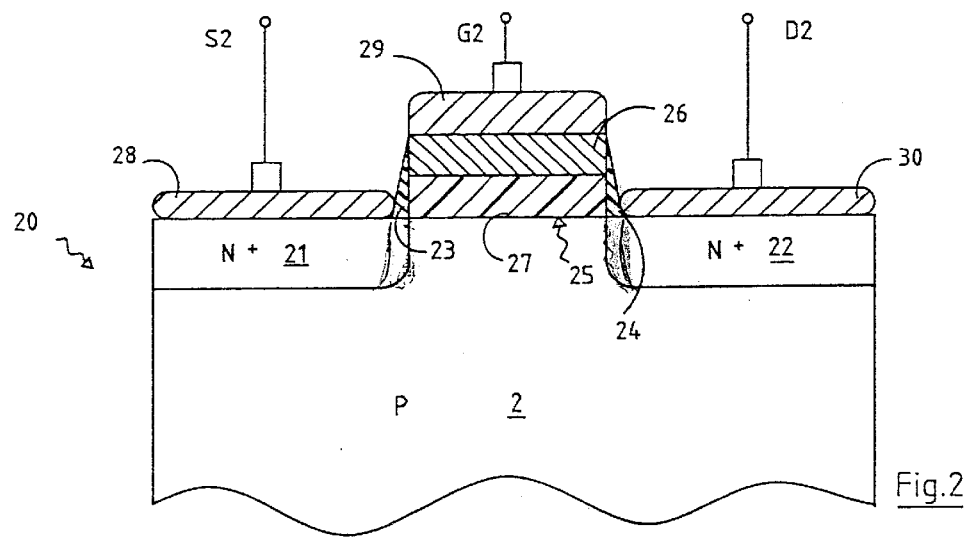
FIG. 2 is a sectional view of a memory cell consisting of a MOS transistor in the OFF state according to a first embodiment of the invention.
Figure 3:
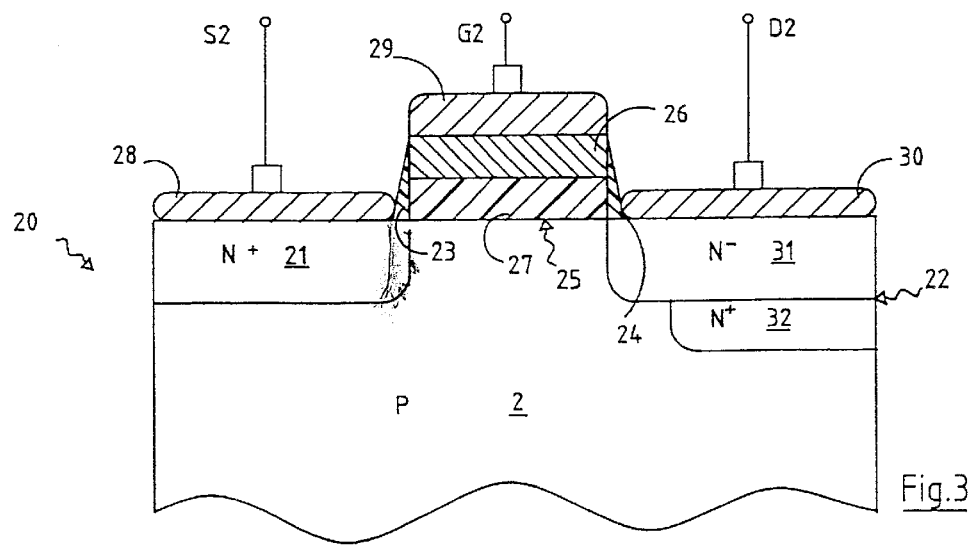
FIG. 3 is a sectional view of a memory cell consisting of a MOS transistor in the OFF state according to a second embodiment of the invention.

With reference to FIGS. 1–3, memory cells constituting the memory device in accordance with the present invention are shown schematically.

In FIG. 1 a memory cell is shown which is formed by a N-channel MOS transistor in the ON state 1 of the LDD type. The memory cell shows a structure consisting of a substrate 2 of the P type and source 3 and drain 4 regions including respective zones 5 and 6 of the $N^+$ type and upper zones 7 and 8 of the $N^-$ type which extend as far as the dielectric spacers 9 and 10 placed at the sides of gate 11 formed by a layer of polysilicon 12 and a layer of silicon oxide 13. Respective layers of silicide 14, 15 and 16 are formed on source 3 and drain 4 regions and on the gate 11 to lower the resistivity of the contact lines that lead to the respective terminals SI, D1 and G1.

In FIG. 2 a memory cell formed by a N-channel MOS transistor in the OFF state 20, according to a first embodiment of the present invention, is shown.

The memory cell 20 presents a structure consisting of a substrate 2 of the P type and source 21 and drain 22 regions formed by regions of silicon of the $N^+$ type which extend as far as the dielectric spacers 23 and 24 placed at the sides of gate 25 formed by a layer of polysilicon 26 and a layer of silicon oxide 27. Respective layers of silicide 28, 29 and 30 are formed on the source 21 and drain 22 regions and on the gate 25 to lower the resistivity of the contact lines that lead to the respective terminals S2, D2 and G2.

In alternative, according to a second embodiment of the invention, the memory cell 20 can present a $N^-$ type silicon zone 31 together with a $N^+$ type silicon zone 32 in the drain region 22. In fact it is possible for them to form resistive paths between the drain and the substrate 2 due to the formation of the layer of silicide 30, because of the lack of the $N^-$ type silicon zone 31, for example when the spacer 24 goes back in relation to its original position before the formation of the layer of silicide 30. For the source, any eventual resistive paths do not create problems because during the memory cells reading step, the source of the cells is biased at the same potential as the substrate and this does not permit the formation of leakage currents.

The memory cells described above are made by a process for the formation of memory cells that show steps which are different in respect of the standard processes. In fact the presence of memory cell 1 with source 3 and drain 4 regions of the LDD type and with memory cells 20 without low dopant concentration diffusion zones, assumes different steps of the process.

Figure 4:
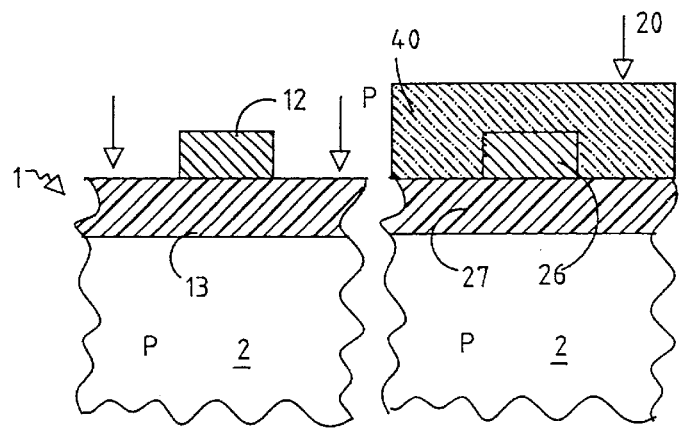
FIG. 4 is a sectional view of a step of a process for the formation of memory cells of FIGS. 1 and 2.
Figure 5:
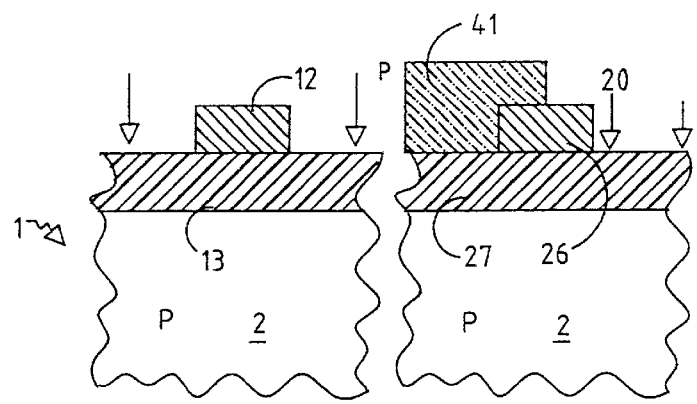
FIG. 5 is a sectional view of a step of a process for the formation of memory cells of FIGS. 1 and 3.

To obtain memory cells in the ON state and memory cells in the OFF state of the type described in FIGS. 1 and 2, it is necessary to use a different mask 40 for the LDD process in the type N dopant implant step, for example phosphorous, in the P-type substrate 2 to form low N type dopant concentration regions. The mask in fact has to completely cover the zones where the active regions of the memory cells in OFF state will be formed, so as not to permit the formation of low dopant concentration layers in both the source and the drain regions of the memory cells, as shown in FIG. 4. In alternative, to obtain memory cells in OFF state as that shown in FIG. 3, it is necessary to use a different mask 41, shown in FIG. 5, which permits a region of silicon at low N type dopant concentration to be made only in the zone where the drain region will be made.

Figure 6:
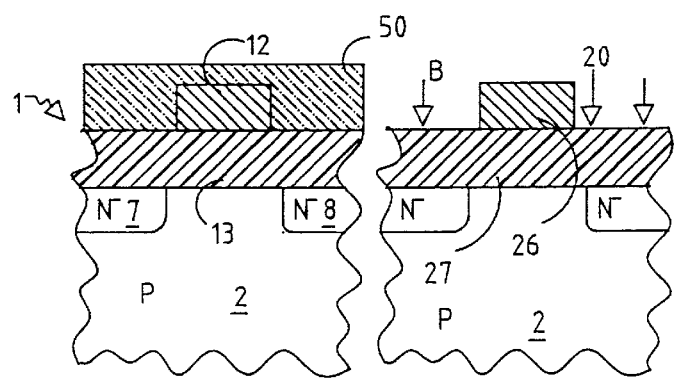
FIG. 6 is a sectional view of a step of a process for the formation of memory cells of FIGS. 1 and 2.
Figure 7:
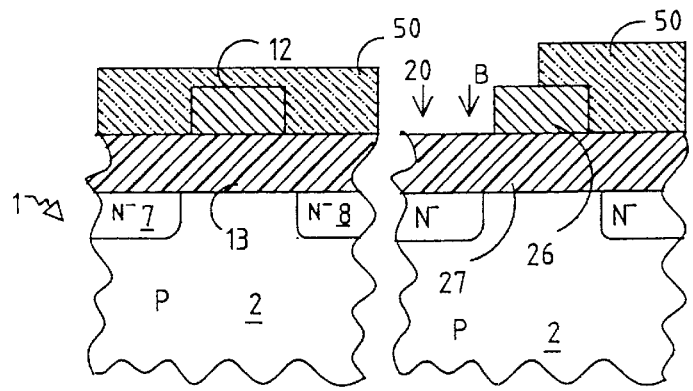
FIG. 7 is a sectional view of a step of a process for the formation of memory cells of FIGS. 1 and 3.

In alternative, according to a variant of the process, the memory cells 20 can be obtained by means of a dopant implant step in the low doping zones, before the formation of the spacers. The dopant which has a different conductivity compared to the dopant in the zones of low doping, that is in our case of P-type (for example boron), permits the formation of regions situated under the spacers with a doping of the same type as the substrate. This is sufficient to inhibit the passing of current in the transistor during the reading step. The boron implant step is carried out on the semiconductor zones where the memory cells in ON state 1 and in OFF state 20 will be made, during the step of definition of the memory cells in OFF state, using a mask 50 which only covers the zones where the memory cells in ON state 1 will be made, as shown in FIG. 6, to obtain the memory cells of FIGS. 1 and 2. In alternative, mask 51 can be used which covers both the zones where the memory cells in ON state 1 will be made and the silicon type $N^-$ 31 zone, as can be seen in FIG. 7, to obtain the memory cells described in FIGS. 1 and 3.

Another way of forming the memory cells in ON state 1 and in OFF state 20 with an LDD process and as shown in FIGS. 1–3, consists of using a specific mask for implanting boron or it is possible to enrich the concentration of P-type dopant making use of a pre-existing implant in a process for the formation of MOS or CMOS transistor, as channel implant.

The process for making the memory cells as in FIGS. 1–3 also includes a step of titanium deposition and successive thermal process for the formation of the layers of silicide, by means of the reaction of the titanium with the silicon or the polysilicon of the active zones.

It must be considered that the present invention, described in the example in relation to a non-volatile memory device consisting of N-channel ROM memory cells, can be applied to other memory devices which include, for example, P-channel ROM memory cells.

Although the application of the invention to the above embodiments has been discussed with reference to the figures, the invention should not be construed as limited thereto. It will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A process for making a non-volatile memory device consisting of memory cells in the ON state and memory cells in the OFF state formed as a MOS transistor, the process comprising the steps of:

forming on a substrate a first type of conductivity on a source region and on a drain region;

forming on the substrate a second type of conductivity on the source region, wherein the source region comprise high dopant zones;

forming a gate with side walls on the substrate; and disposing dielectric spacers on the side walls of the gate comprising the sub-steps of:

forming low dopant zones underneath the dielectric spacers in the source regions and in the drain regions; and forming layers of silicide on top of one or more active regions selected from the group of active regions consisting of the source region, the drain region, and the gate;

wherein the sub-step of forming low dopant zones underneath the dielectric spacers includes forming low dopant zones underneath the dielectric spacers in the source regions and in the drain regions for one or more memory cells in an ON state and forming low dopant zones underneath the dielectric spacers in the drain regions of one or more memory cells in an OFF state, using a mask which covers areas of the source region of the one or more memory cells in the OFF state which are formed by a successive dopant implant of a second type of conductivity on the substrate.

2. The process according to claim 1, further comprising the steps of:

placing a mask on the source and on the drain and on the gate of the memory cells which will be in the ON state;

placing a mask on the drain of the memory cells in the OFF state; and implanting a dopant of a first type of conductivity so that a dopant of a first type of conductivity will be made under the dielectric spacers and adjacent to the source region of the memory cells in the OFF state and prior to the step of disposing dielectric spacers and prior to the step of forming on the substrate a second type of conductivity resulting in a the high dopant zones.

3. The process according to claim 1, wherein the step of placing a mask includes placing a mask on the source and on the drain and on the gate of the memory cells defined to be in the ON state and the drain of the memory cells defined to be in the OFF state so that a dopant of a first type of conductivity will be made under the dielectric spacers prior to the step of disposing dielectric spacers and prior to the step of forming on the substrate a second type of conductivity resulting in a the high dopant zones.

4. The process according to claim 1, wherein the step of forming a substrate includes forming on a substrate a memory cell comprising a read only memory (ROM) cell.

5. The process according to claim 4, wherein the step of forming a substrate includes forming on a substrate a memory cell comprising a read only memory (ROM) cell that are part of a smart card.

6. A process for making a non-volatile memory device consisting of memory cells in the ON state and memory cells in the OFF state formed as a MOS transistor, the process comprising the steps of:

forming on a substrate of a first type of conductivity source regions and a drain regions of said memory cells of a second conductivity type;

said source regions and drain regions of said memory cells, comprising high dopant zones;

forming a gate with side walls on the substrate; and disposing dielectric spacers on the side walls of the gate comprising the sub-steps of:

forming low dopant zones underneath the dielectric spacers in the source regions and in the drain regions of one or more memory cells; and forming layers of silicide on top of the source region, the drain region, and the gates of said memory cells.

7. The process according to claim 1, wherein the sub-step of forming low dopant zones under the dielectric spacers includes forming low dopant zones underneath all the dielectric spacers of all the memory cells.

8. The process according to claim 7, further comprising the step of:

placing a mask on the source and on the drain and on the gate of the memory cells which will be in the ON state so that a dopant of a first type of conductivity will be made under the dielectric spacers prior to the step of disposing dielectric spacers and prior to the step for the formation of forming a second type of conductivity resulting in a the high dopant zones.

* * * * *